(12) United States Patent
Chen et al.

(10) Patent No.: US 9,281,282 B2
(45) Date of Patent: Mar. 8, 2016

(54) SUBSTRATE CAPABLE OF ELECTROSTATIC SELF-PROTECTION AND MANUFACTURING METHOD THEREOF

(71) Applicants: BOE TECHNOLOGY GROUP CO., LTD., Beijing (CN); BEIJING BOE DISPLAY TECHNOLOGY CO., LTD., Beijing (CN)

(72) Inventors: Xi Chen, Beijing (CN); Yuchun Feng, Beijing (CN); Jianfeng Yuan, Beijing (CN)

(73) Assignees: BOE TECHNOLOGY GROUP CO., LTD., Beijing (CN); BEIJING BOE DISPLAY TECHNOLOGY CO. LTD., Beijing (CN)

(*) Notice: Subject to any disclaimer, the term of this patent is extended or adjusted under 35 U.S.C. 154(b) by 0 days.

(21) Appl. No.: 14/378,948

(22) PCT Filed: Nov. 19, 2013

(86) PCT No.: PCT/CN2013/087443
§ 371 (c)(1),
(2) Date: Aug. 14, 2014

(87) PCT Pub. No.: WO2015/027578
PCT Pub. Date: Mar. 5, 2015

(65) Prior Publication Data
US 2015/0255408 A1 Sep. 10, 2015

(30) Foreign Application Priority Data
Aug. 29, 2013 (CN) .......................... 2013 1 0384921

(51) Int. Cl.
*H01L 23/60* (2006.01)
*H01L 29/40* (2006.01)
*H01L 29/417* (2006.01)
*H01L 29/423* (2006.01)
*H01L 29/66* (2006.01)
(Continued)

(52) U.S. Cl.
CPC .......... *H01L 23/60* (2013.01); *G02F 1/136204* (2013.01); *H01L 29/401* (2013.01); *H01L 29/41733* (2013.01); *H01L 29/41775* (2013.01); *H01L 29/42356* (2013.01); *H01L 29/42376* (2013.01); *H01L 29/42384* (2013.01); *H01L 29/66484* (2013.01); *H01L 29/66742* (2013.01); *H01L 29/78645* (2013.01)

(58) Field of Classification Search
CPC . G02F 1/136204; G02F 1/1345; H01L 27/12; H01L 27/124; H01L 27/1248; H01L 27/0251; H01L 29/78675
See application file for complete search history.

(56) References Cited

U.S. PATENT DOCUMENTS 8,319,904 B2 * 11/2012 Hwang ............. G02F 1/136204
  349/192
2006/0118787 A1 * 6/2006 Lee ....................... H01L 27/124
  257/66

(Continued)

*Primary Examiner* — Jae Lee
*Assistant Examiner* — Mohammed R Alam
(74) *Attorney, Agent, or Firm* — Ladas & Parry LLP

(57) ABSTRACT

A substrate capable of electrostatic self-protection and a manufacturing method thereof, and the substrate (1) comprises: a panel area (2); and a first gate metal layer (3) and a source/drain metal layer (5) disposed on at least one side of the panel area (2). The first gate metal layer (3) and the source/drain metal layer (5) are arranged parallel to each other in a longitudinal direction and adjacent to each other; at least one tip (31) is protruded from the first gate metal layer (3) towards the source/drain metal layer (5); and/or at least one tip (31) is protruded from the source/drain metal layer (5) towards the first gate metal layer (3).

18 Claims, 2 Drawing Sheets

(51) Int. Cl.
*H01L 29/786* (2006.01)
*G02F 1/1362* (2006.01)

(56) References Cited

U.S. PATENT DOCUMENTS

| | | | |
|---|---|---|---|
| 2006/0240606 A1* | 10/2006 | Motoshima et al. | 438/149 |
| 2008/0083927 A1* | 4/2008 | Nishiura et al. | 257/72 |
| 2010/0073587 A1* | 3/2010 | Satoh | G02F 1/13452 349/40 |
| 2010/0238368 A1* | 9/2010 | Kim | G02F 1/13458 349/40 |
| 2011/0039362 A1* | 2/2011 | Long et al. | 438/34 |
| 2014/0176838 A1* | 6/2014 | Hong | G02F 1/134363 349/33 |

* cited by examiner

SUBSTRATE CAPABLE OF ELECTROSTATIC SELF-PROTECTION AND MANUFACTURING METHOD THEREOF

CROSS REFERENCE TO RELATED APPLICATIONS

This application is based on International Application No. PCT/CN2013/087443 filed on Nov. 19, 2013, which claims priority to Chinese National Application No. 201310384921.8 filed on Aug. 29, 2013. The entire contents of each and every foregoing application are incorporated herein by reference.

TECHNICAL FIELD

Embodiments of the present invention relate to a substrate capable of electrostatic self-protection and a manufacturing method thereof.

BACKGROUND

With the progress of display technology, in order to reduce the manufacturing cost and improve the competitiveness, the production lines of the thin-film transistor liquid crystal display (TFT-LCD) manufacturing industry are gradually improved; the requirements on processing technology and control become higher; and electrostatic protection is also a problem to be solved in the high-generation production line. In order to prevent electrostatic breakdown in the manufacturing process, a short-circuit wire or another design is usually added into a panel design, but the designs are only directed towards electrostatic breakdown in the manufacturing process after the formation of circuits. At present, the sizes of glass substrates in the high-generation production line are increasingly increased, and meanwhile charges can be easily accumulated by a bulk metal. Therefore, a common electrode outside a panel area, formed with continuous large-area metal, becomes a common generating source of electrostatic discharge (ESD) in the manufacturing process of a TFT array substrate. As the charges can be easily accumulated by bulk metal, uneven local electric field will be caused in a plasma environment such as a plasma enhanced chemical vapor deposition (PECVD) equipment or in an environment in which rollers of equipment rub against the edges of glass, and hence tips tend to discharge and metals on different layers tend to generate ESD. There is still no sound solution to the defects relevant to this type of electrostatics.

In order to uniformly apply voltage to internal common electrodes of a conventional panel, the metal material for peripheral common electrodes adopts a large-width design without bridge connection. But the defect of such design lies in that: in the case of tip discharge due to local potential difference, the electrostatic energy is large, and hence adverse ESD tends to occur.

SUMMARY

In one aspect, the present invention provides a substrate capable of electrostatic self-protection, which comprises: a panel area; and a first gate metal layer and a source/drain metal layer disposed on at least one side of the panel area, wherein the first gate metal layer and the source/drain metal layer are arranged parallel to each other in a longitudinal direction and adjacent to each other; at least one tip is protruded from the first gate metal layer towards the source/drain metal layer; and/or at least one tip is protruded from the source/drain metal layer towards the first gate metal layer.

For instance, the first gate metal layer and the source/drain metal layer may be respectively divided into two sections in the longitudinal direction.

For instance, the first gate metal layer and the source/drain metal layer may be disposed on each of two opposite sides of the panel area on the substrate.

For instance, the substrate may further comprise: a second gate metal layer; the second gate metal layer is disposed on one side adjacent to the side, provided with the first gate metal layer and the source/drain metal layer, of the panel area; at least one tip is protruded from the second gate metal layer towards the source/drain metal layer; and/or at least one tip is protruded from the source/drain metal layer towards the second gate metal layer.

For instance, the second gate metal layer may be respectively disposed on two opposite sides of the panel area on the substrate.

For instance, the width of the second gate metal layer may be greater than the width of the first gate metal layer.

For instance, the first gate metal layer and the source/drain metal layer may be disposed on each of two opposite sides of the panel area on the substrate; and the second gate metal layer may be respectively disposed on the other two opposite sides of the panel area on the substrate.

For instance, projections of the first gate metal layers and the source/drain metal layers on the substrate may be spaced from each other or at least partially overlapped with each other.

For instance, projections of the second gate metal layers and the source/drain metal layers may be spaced from each other or at least partially overlapped with each other.

In another aspect, the present invention also discloses a method for manufacturing a substrate capable of electrostatic self-protection, which comprises: forming a gate metal film on the substrate; patterning the gate metal film so as to form a first gate metal layer on at least one side of a panel area on the substrate; forming a source/drain metal film on the first gate metal layer; and patterning the source/drain metal film so as to form a source/drain metal layer on at least one side of the panel area on the substrate, wherein the first gate metal layer and the source/drain metal layer are arranged parallel to each other in a longitudinal direction and adjacent to each other; at least one tip is protruded from the first gate metal layer towards the source/drain metal layer; and/or at least one tip is protruded from the source/drain metal layer towards the first gate metal layer.

For instance, the method may further comprise: forming a gate insulating film and a semiconductor active layer between the first gate metal layer and the source/drain metal layer, wherein the first gate metal layer is covered by the gate insulating film; and the source/drain metal layer and the semiconductor active layer are patterned at the same time For instance, the step of patterning the gate metal film may comprise: forming a second gate metal layer on one side adjacent to the side of the panel area on the substrate, provided with the first gate metal layer and the source/drain metal layer; and protruding at least one tip from the second gate metal layer towards the source/drain metal layer, and/or protruding at least one tip from the source/drain metal layer towards the second gate metal layer.

For instance, the width of the second gate metal layer may be greater than the width of the first gate metal layer.

For instance, projections of the first gate metal layers and the source/drain metal layers on the substrate may be spaced from each other or at least partially overlapped with each other.

For instance, projections of the second gate metal layers and the source/drain metal layers may be spaced from each other or at least partially overlapped with each other.

The substrate and the manufacturing method, provided by the embodiments of the present invention, can induce and transfer electrostatics produced in the manufacturing process to the periphery of the substrate, and hence reduce the possibility of ESD on the panel area and effectively improve the product yield.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Figure 1:
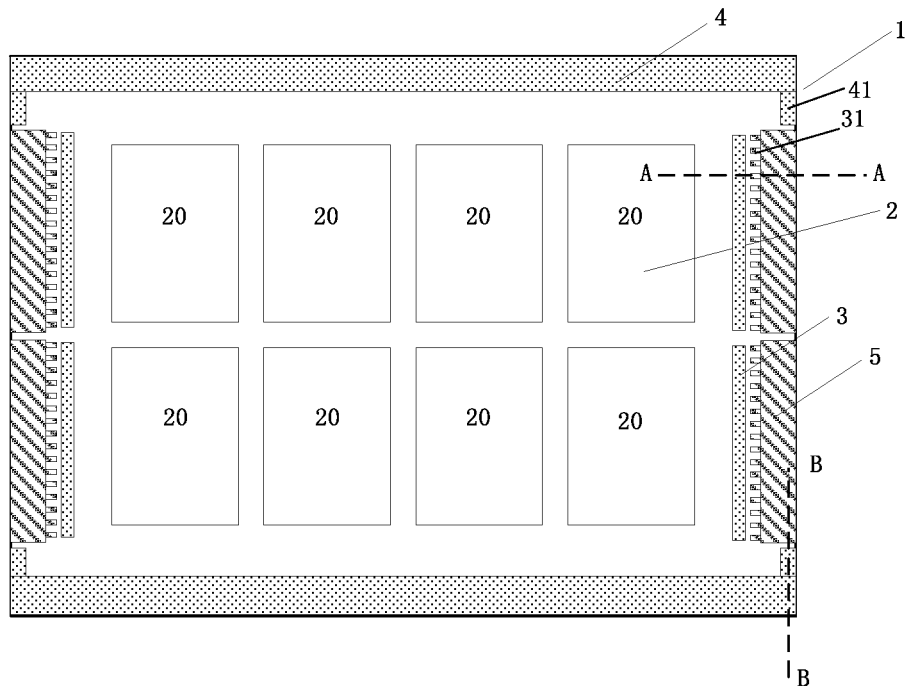
FIG. 1 is a schematic diagram of a glass substrate capable of electrostatic self-protection provided by an embodiment of the present invention.

FIG. 1 is a schematic diagram of a substrate capable of electrostatic self-protection provided by an embodiment of the present invention.

As illustrated in FIG. 1, a panel area 2 is disposed in the middle of a substrate 1 and comprises a plurality of panel units 20, and these panel units 20 are configured to form a display panel after splitting. A first gate metal layer 3 and a source/drain metal layer 5 are disposed on each of two opposite sides of the panel area 2; a second gate metal layer 4 is disposed on each of the other two opposite sides of the panel area 2; and the width of the first gate metal layer 3 is less than the width of the second gate metal layer 4. As the second gate metal layer 4 is required for the accumulation of electrostatic charges, the width it needs must be wider. The second gate metal layers 4 and the source/drain metal layers 5 on the sides of the substrate 1 are configured to accumulate electrostatic charges produced in a manufacturing process and hence avoid accumulation of electrostatics in the panel area 2. The first gate metal layer 3 and the source/drain metal layer 5 are arranged parallel to each other in the longitudinal direction and adjacent to each other and respectively divided into a plurality of sections in the longitudinal direction, for instance, divided into two sections in FIG. 2.

A plurality of tips 41 are protruded from the second gate metal layer 4 towards the source/drain metal layer 5, and/or a plurality of tips 31 are protruded from the source/drain metal layer 5 to the first gate metal layer 3. In the case of excessive accumulated electrostatic energy, as the second gate metal layer 4 and the source/drain metal layer 5 have different potential differences (PD), the energy can be released, at first, through the plurality of tips 41 extended from the second gate metal layer 4 to the source/drain metal layer 5, so that the two metal layers are subjected to short circuit. After short circuit, the energy accumulated by the electrostatics on the metal layers will be continuously released at the nearest position of a short-circuit position, namely the plurality of tips 31 that are extended from the source/drain metal layer 5 to the first gate metal layer 3, and hence the electrostatic energy between the second gate metal layer 4 and the source/drain metal layer 5 can be reduced. Due to this design, not only the electrostatics produced in the manufacturing process can be induced to the second gate metal layer 4 and the source/drain metal layer 5 on the periphery of the glass substrate 1 but also the problem of excessive accumulated electrostatic energy caused by the provision of wide metals on the periphery of the glass substrate can be avoided by the ESD of a device.

By adoption of the above structure, ESD on the panel area 2 can be avoided. It should be understood by those skilled in the art that the function of tip discharge also can be achieved by forming a plurality of tips protruded from the source/drain metal layer 5 towards the second gate metal layer 4 or a plurality of tips protruded from the first gate metal layer 3 towards the source/drain metal layer 5.

For instance, the first gate metal layer 3, the second gate metal layer 4 and the source/drain metal layer 5 are respectively formed of a Mo/Al/Mo three-layer composite metal. In the embodiment, projections of the first and second gate metal layers 3 and 4 and the source/drain metal layers 5 on the substrate 1 are spaced from each other.

Figure 2:
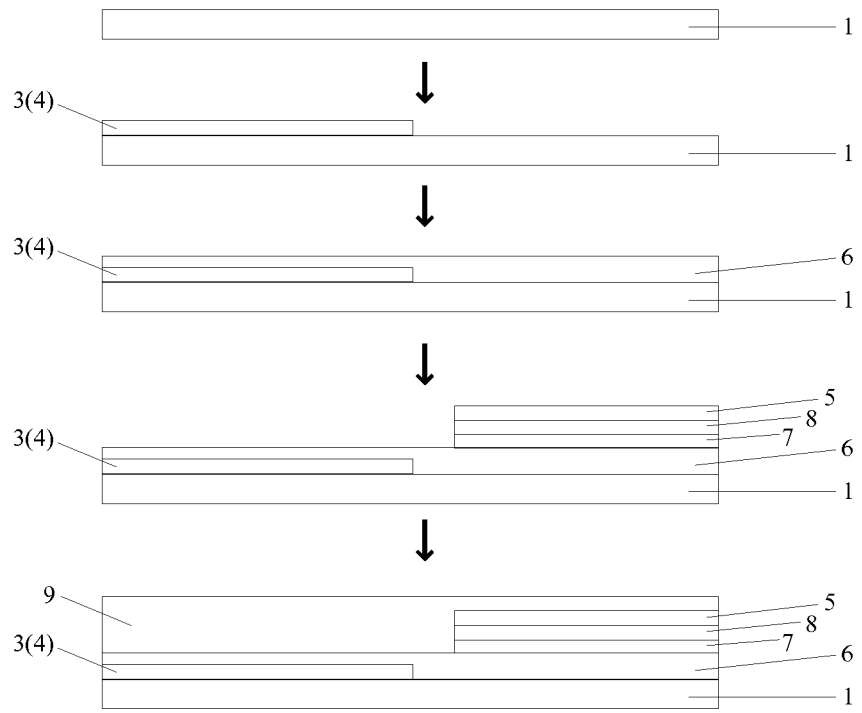
FIG. 2 is a flowchart of a method for manufacturing the glass substrate capable of electrostatic self-protection provided by an embodiment of the present invention.

FIG. 2 is a flowchart of a method for manufacturing the substrate capable of electrostatic self-protection, provided by the embodiment of the present invention, and the section views as shown in FIG. 2 are cross-section views obtained along dotted lines A-A and B-B in FIG. 1 during manufacturing.

As illustrated in FIG. 2, a gate metal film is deposited on a substrate 1 such as a glass substrate at first; the gate metal film is patterned by a patterning process comprising exposing and etching to form a first gate metal layer 3 and/or a second gate metal layer 4; a gate insulating layer 6 is deposited on the gate metal layer 3 and/or 4 to cover the first gate metal layer 3 and/or the second gate metal layer 4; a semiconductor active layer 7, an ohmic contact layer 8 and a source/drain metal film are deposited on the gate insulating layer 6 in sequence; the semiconductor active layer 7, the ohmic contact layer 8 and the source/drain metal film are patterned by a patterning process comprising exposing and etching to form a source/drain metal layer 5, and meanwhile the semiconductor active layer 7 and the ohmic contact layer 8 under the source/drain metal layer 5 are also patterned; and a protective layer 9 is deposited. The protective layer 9 may be a passivation layer, and for instance, may be configured to achieve planarization.

Thus, the substrate capable of electrostatic self-protection provided by the embodiment of the present invention is manufactured. The above manufacturing process is performed synchronously with the manufacturing process of the panel; no additional processing step is added; and the subsequent manufacturing process(es) of the panel will not affect the formed structure.

Figure 3:
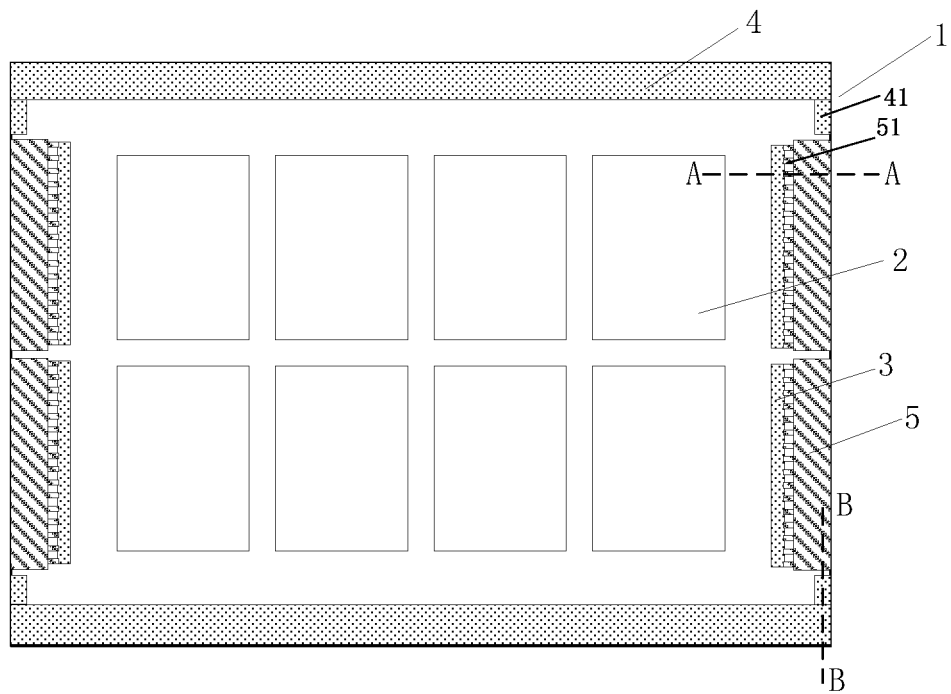
FIG. 3 is a schematic diagram of a glass substrate capable of electrostatic self-protection provided by another embodiment of the present invention.

FIG. 3 is a schematic diagram of a substrate capable of electrostatic self-protection provided by another embodiment of the present invention. A substrate 1 as shown in FIG. 3 is similar to the substrate 1 as shown in FIG. 1, and the only difference lies in that: on the substrate, the projection of the source/drain metal layer 5 and the projection of the tips 41 protruded from the second gate metal layer 4 are at least partially overlapped, and the projection of the first gate metal layer 3 and the projection of the tips 51 protruded from the source/drain metal layer 5 are at least partially overlapped. It should be understood by those skilled in the art that the function of tip discharge can also be achieved by forming a plurality of tips protruded form the source/drain metal layer 5 towards the second gate metal layer 4 or a plurality of tips protruded from the first gate metal layer 3 towards the source/drain metal layer 5.

Figure 4:
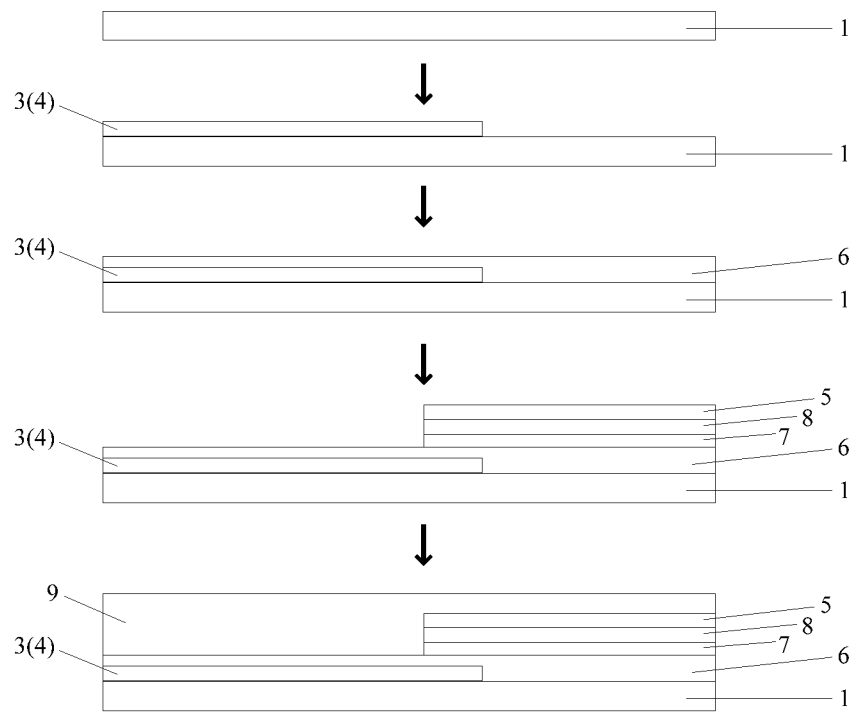
FIG. 4 is a flowchart of a method for manufacturing the glass substrate capable of electrostatic self-protection provided by another embodiment of the present invention.

FIG. 4 is a flowchart of a method for manufacturing a substrate capable of electrostatic self-protection, provided by another embodiment of the present invention, and sectional views as shown in FIG. 4 are cross-section views along dotted lines A-A and B-B in FIG. 3 during manufacturing.

The manufacturing process flow as shown in FIG. 4 is similar to the manufacturing process flow as shown in FIG. 2. No further description will be given here.

It should be noted that the above embodiments are only preferred embodiments of the present invention and not intended to limit the present invention. In fact, proper electrostatic self-protection structures may be selected by those skilled in the art according to the edge margin of panels manufactured on the glass substrate, and those skilled in the art may arrange the first gate metal layer and the source/drain metal layer on only one side of the panel area or on each of sides of the panel area without the second gate metal layer. In order to reduce the mask exposure cost, the substrate capable of electrostatic self-protection provided by the embodiment of the present invention may have a symmetrical structure. But it should be understood by those skilled in the art that the substrate may also be arranged to be unsymmetrical. The deformations or modifications should all fall within the spirit and instruction of the present invention.

The substrate and the manufacturing method thereof, provided by the embodiments of the present invention, can induce and transfer the electrostatics produced in the manufacturing process to the periphery of the substrate, and hence reduce the possibility of ESD on the panel area and effectively improve the production yield. Moreover, ESD is produced through the gate metal layer(s) and the source/drain metal layer of the substrate, thus the electrostatic energy accumulated by the metal layers on the periphery can be released and the electrostatic accumulation in different process steps can be avoided, and hence the TFT substrate has self-protection capability.

The foregoing is only the preferred embodiments of the present invention and not intended to limit the scope of protection of the present invention. The scope of protection of the present invention should be defined by the appended claims.

The invention claimed is:

1. A substrate capable of electrostatic self-protection, comprising:
a panel area, comprising a plurality of panel units each configured to form a display panel after splitting; and
a first gate metal layer and a source/drain metal layer disposed on at least one side of the panel area and disposed outside of the plurality of panel units,
wherein the first gate metal layer and the source/drain metal layer are arranged parallel to each other in a longitudinal direction and adjacent to each other; at least one tip is protruded from the first gate metal layer towards the source/drain metal layer; and/or at least one tip is protruded from the source/drain metal layer towards the first gate metal layer.

2. The substrate according to claim 1, wherein the first gate metal layer and the source/drain metal layer are respectively divided into at least two sections in the longitudinal direction.

3. The substrate according to claim 1, wherein the first gate metal layer and the source/drain metal layer are disposed on each of two opposite sides of the panel area on the substrate.

4. The substrate according to claim 1, further comprising:
a second gate metal layer,
wherein the second gate metal layer is disposed on one side adjacent to the side, provided with the first gate metal layer and the source/drain metal layer, of the panel area; at least one tip is protruded from the second gate metal layer to the source/drain metal layer; and/or at least one tip is protruded from the source/drain metal layer to the second gate metal layer.

5. The substrate according to claim 4, wherein the second gate metal layer is disposed on each of two opposite sides of the panel area on the substrate.

6. The substrate according to claim 4, wherein a width of the second gate metal layer is greater than a width of the first gate metal layer.

7. The substrate according to claim 4, wherein the first gate metal layer and the source/drain metal layer are disposed on each of two opposite sides of the panel area on the substrate; and the second gate metal layer is respectively disposed on the other two opposite sides of the panel area on the substrate.

8. The substrate according to claim 1, wherein projections of the first gate metal layers and the source/drain metal layers on the substrate are spaced from each other or at least partially overlapped with each other.

9. The substrate according to claim 4, wherein projections of the second gate metal layers and the source/drain metal layers are spaced from each other or at least partially overlapped with each other.

10. The substrate according to claim 1, further comprising:
a second gate metal layer,
wherein the second gate metal layer is disposed on one side adjacent to the side, provided with the first gate metal layer and the source/drain metal layer, of the panel area; at least one tip is protruded from the second gate metal layer to the source/drain metal layer; and/or at least one tip is protruded from the source/drain metal layer to the second gate metal layer.

11. The substrate according to claim 4, wherein the first gate metal layer and the source/drain metal layer are disposed on each of two opposite sides of the panel area on the substrate; and the second gate metal layer is respectively disposed on the other two opposite sides of the panel area on the substrate.

12. A method for manufacturing a substrate capable of electrostatic self-protection, the substrate comprising a panel area with a plurality of panel units each configured to form a display panel after splitting, the method comprising:
forming a gate metal film on the substrate;
patterning the gate metal film so as to form a first gate metal layer on at least one side of a panel area on the substrate;

forming a source/drain metal film on the first gate metal layer; and patterning the source/drain metal film so as to form a source/drain metal layer on at least one side of the panel area on the substrate, wherein the first gate metal layer and the source/drain metal layer are arranged parallel to each other in a longitudinal direction and adjacent to each other and are disposed outside of the plurality of panel units; at least one tip is protruded from the first gate metal layer towards the source/drain metal layer; and/or at least one tip is protruded from the source/drain metal layer towards the first gate metal layer.

13. The method according to claim 12, further comprising:

forming a gate insulating film and a semiconductor active layer between the first gate metal layer and the source/drain metal layer, wherein the first gate metal layer is covered by the gate insulating film; and the source/drain metal layer and the semiconductor active layer are patterned at the same time.

14. The method according to claim 12, wherein patterning the gate metal film further comprises:

forming a second gate metal layer on one side adjacent to the side, provided with the first gate metal layer and the source/drain metal layer, of the panel area on the substrate; and protruding at least one tip from the second gate metal layer towards the source/drain metal layer, and/or protruding at least one tip from the source/drain metal layer towards the second gate metal layer.

15. The method according to claim 14, wherein a width of the second gate metal layer is greater than a width of the first gate metal layer.

16. The method according to claim 12, wherein projections of the first gate metal layers and the source/drain metal layers on the substrate are spaced from each other or at least partially overlapped with each other.

17. The method according to claim 14, wherein projections of the second gate metal layers and the source/drain metal layers are spaced from each other or at least partially overlapped with each other.

18. The method according to claim 13, wherein patterning the gate metal film further comprises:

forming a second gate metal layer on one side adjacent to the side, provided with the first gate metal layer and the source/drain metal layer, of the panel area on the substrate; and protruding at least one tip from the second gate metal layer towards the source/drain metal layer, and/or protruding at least one tip from the source/drain metal layer towards the second gate metal layer.

* * * * *